United States Patent [19]

Kuwajima et al.

[11] Patent Number: 4,612,662
[45] Date of Patent: Sep. 16, 1986

[54] CONTROL CIRCUIT

[75] Inventors: Takeshi Kuwajima; Kiyoshi Amazawa, both of Tokyo, Japan

[73] Assignee: NEC Corporation and Clarion Co., Ltd., Tokyo, Japan

[21] Appl. No.: 645,124

[22] Filed: Aug. 28, 1984

[30] Foreign Application Priority Data

Sep. 2, 1983 [JP] Japan .................................. 58-162379

[51] Int. Cl.$^4$ ............................................... H04H 5/00
[52] U.S. Cl. ......................................... 381/10; 381/13
[58] Field of Search .............................. 381/10, 11, 13

[56] References Cited

U.S. PATENT DOCUMENTS

| 3,823,268 | 7/1974 | Modafferi | 381/10 |
| 3,999,132 | 12/1976 | Smith | 381/11 |
| 4,146,747 | 3/1979 | Numata et al. | 381/11 |
| 4,157,455 | 6/1979 | Okatani et al. | 381/11 |
| 4,356,350 | 10/1982 | Ienaka | 381/10 |
| 4,390,749 | 6/1983 | Pearson | 381/10 |

Primary Examiner—Forester W. Isen
Attorney, Agent, or Firm—Flynn, Thiel, Boutell & Tanis

[57] ABSTRACT

A control circuit is configured to detect by an active filter white noise levels in detection outputs from an intermediate frequency amplifier in an FM stereo demodulation circuit so as to control the separation of outputs from the stereo demodulation circuit into left and right stereo channels, responsively to the white noise level, and is characterized in provision of a current detection circuit which is actuated by the output from the active filter and responsive to a current flowing into a resistor connected between the feedback terminal of the active filter and a reference potential point to control a blend control circuit so as to change the point whereat the separation ratio begins to vary.

4 Claims, 5 Drawing Figures

CONTROL CIRCUIT

FIELD OF THE INVENTION

This invention relates to an FM stereo demodulating circuit, and more particularly to an improvement of a control circuit to change the separation ratio of outputs from the FM stereo demodulating circuit into the left and right stereo channels responsively to a detected white level of a detection output from an intermediate frequency (IF) amplifier.

BACKGROUND OF THE INVENTION

The description is preceded by an explanation of a prior art control circuit illustrated in FIG. 1 by a block circuit diagram. As shown in FIG. 1, among various components connected in sequence to an FM IF detection input 8, reference numeral 1 denotes a high-pass filter (HPF), reference numerals 2, 3, 21 and 22 designate amplifiers, 4 refers to a white noise level detection circuit, 5 refers to an AGC drive circuit, 6 is a blend control circuit, 7 is a stereo demodulation circuit, 16 is a smoothing circuit, 17 is a 38 kHz switching pulse circuit, 18 is a detection circuit, 8 through 10 are terminals, and 11 and 12 are resistors. The circuitry of FIG. 1 is employed in an FM stereo demodulation circuit as a control circuit to improve the signal-to-noise ratio (SNR) of signals with intermediate and weak electric fields. Namely, the control circuit is configured to detect white noise levels in detection signals supplied from the FM IF stage and to vary the stereo channels separation of outputs from the FM stereo demodulation circuit between the maximum value and zero, i.e. monoral state, responsively to the detected white noise level. The high-pass filter 1, amplifier 2 and resistors 11 and 12 form an active high-pass filter so that the high frequency components such as white noise in the FM IF detection outputs entered in the terminal 8 pass through the control circuit but the FM composite signal components do not. The latter signal components pass through a low-pass filter 19 in FIG. 1, and pilot signals thereof are entered in the switching pulse circuit 17 via a band-pass filter 20 and an amplifier 21 whereas the composite signals are entered in the stereo demodulation circuit 7 via an amplifier 22. The white noise components extracted from the FM IF detection output by the said active high-pass filter are entered in the white noise level detection circuit 4 via the amplifier 3. If the detection circuit 4 detects white noise components above a given reference level, it supplies an electric current responsive to the magnitude of the detected white noise level. The output from the detection circuit 4 is smoothed and voltage converted by the smoothing circuit 16 to serve as control voltages of the AGC drive circuit 5 and of the blend control circuit 6. More specifically, when the voltage of the output from the smoothing circuit 16 is increased, the AGC drive circuit 5 controls the amplifier 3 to decrease the gain thereof. The blend control circuit 6 controls the 38 kHz switching pulse circuit 17 to decrease the amplitude of the output thereof for switching the stereo demodulation circuit 7. As the output amplitude of the 38 kHz switching pulse circuit 17 is decreased, the separation of the output from the stereo demodulation circuit 7 is varied from the maximum value to zero, i.e. monoral condition. More specifically, in the circuit of FIG. 1, an increase of the white noise level in the FM IF detection output entered in the terminal 8 invites a greater gain decrease of the amplifier 3 and a less separation into two output terminals 34 and 35 of the stereo demodulation circuit 7. FIG. 2 shows the gain attenuation of the amplifier 3 and the separation of the outputs from the stereo demodulation circuit 7 with respect to the white noise level. This shows that, in the prior art control circuit of FIG. 1, if the respective components or stages of the control circuit are given fixed constants, changes in the gain decrease of the amplifier 3 and in the separation of the output of the stereo demodulation circuit 7 are uniformly fixed. If it is required to change the point whereat the output separation of the stereo demodulation circuit 7 begins to vary with a change in the white noise level, the requirement is met by a change, for example, in the sensitivity of the white noise level detection circuit 4. However, this invites a change of the point whereat the automatic gain control of the amplifier 3 is commenced, followed by a change of the gain attenuation ratio of the amplifier 3. It should be noted here that the detection circuit 18 is also supplied with the output from the amplifier 3 to control other network, for example, other than the output separation of the stereo demodulation circuit 7. Therefore, a change in the gain attenuation of the amplifier 3 invites a problem that the point whereat the detection circuit 18 is rendered operative also varies. Additionally, in case that the control circuit is integrated on a semiconductor substrate, additional terminals unique to the control circuit must be provided.

OBJECT OF THE INVENTION

It is therefore an object of the invention to alleviate the drawbacks involved in the prior art, by providing a control circuit which is readily changeable in the point whereat the separation into left and right stereo channels of the outputs from the stereo demodulation circuit begins to vary with a change in the white noise level, without changes of other circuit components such as the detection circuit 18 in the respect of where to start to operate.

It is another object of the invention to provide a control circuit which does not require additional terminals unique thereto for circuit integration thereof, and hence facilitates employment of the IC technique.

SUMMARY OF THE INVENTION

In accordance with the invention, there is provided a control circuit including: an active filter circuit for selecting high band noise components from FM IF detection outputs; first amplifier for amplifying the output from the active filter circuit; smoothing means for detecting and smoothing the high band noise in the output from the first amplifier; first control means responsive to the output from the smoothing means to control the gain attenuation of the first amplifier; and second control means responsive to the output from the smoothing means to control the separation into left and right stereo channels of FM stereo demodulation outputs, which control circuit is characterized in employment of a current detection circuit which is responsive to the amount of the electric current flowing into a resistor connected between the feedback terminal of the active filter circuit and a reference electric potential point to supply an output to the second control circuit so as to change the point whereat the separation ratio begins to vary.

The invention will be better understood from the description given below by way of preferred embodiments illustrated.

DETAILED DESCRIPTION OF THE PREFERRED EMBODIMENTS

Figure 3:
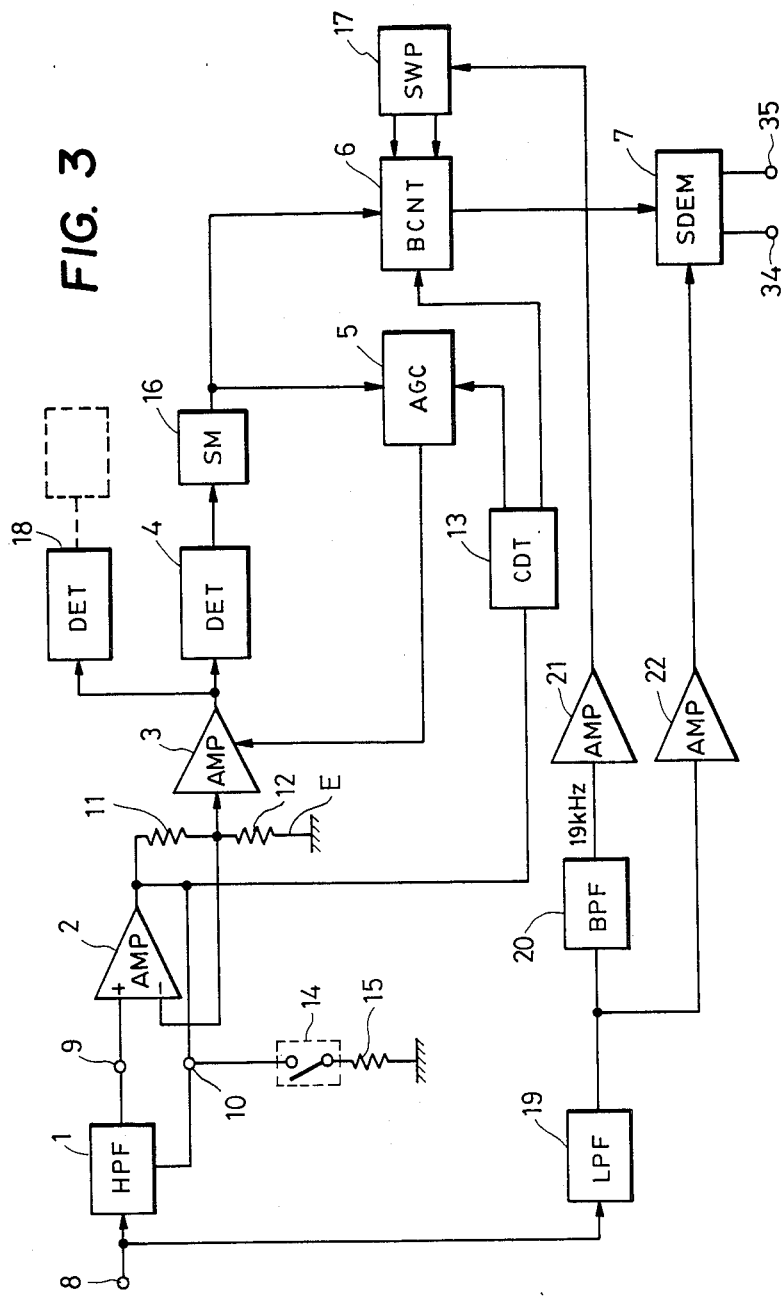
FIG. 3 is a block diagram of a control circuit embodying the invention.

Referring to FIG. 3 which is a block diagram of a control circuit embodying the invention, a high-pass filter 1 has an FM IF input terminal 8 and two outputs one of which is connected to the "+" terminal of an amplifier 2 via a terminal 9 and the other is connected to one end of a switch 14 via a terminal 10. The other end of the switch 14 is grounded through a resistor 15. The output of the amplifier 2 are coupled to the input of a current detection circuit 13, one end of a resistor 11 and the terminal 10. The other end of the resistor 11 is connected to the "−" terminal of the amplifier 2 and grounded (reference potential point E) via a resistor 12. Two outputs of the current detection circuit 13 are coupled to the AGC drive circuit 5 and to the blend control circuit 6, respectively. The output of the amplifier 3 is connected to the white noise level detection circuit 4 and also to the other detection circuit 18. The output of the white noise level detection circuit 4 is connected to the AGC drive circuit 5 and to the blend control circuit 6 via the smoothing circuit 16. The input of the blend control circuit 6 is connected to the 38 kHz switching pulse circuit 17 and the output thereof is entered in the stereo demodulation circuit 7 which has the stereo output terminals 34 and 35.

The input terminal 8 is also coupled to the input of the low-pass filter (LPF) 19 having two outputs one of which is connected to an amplifier 21 via a band-pass filter (BPF) 20 and hence to the 38 kHz switching pulse circuit 17 and the other is connected to the stereo demodulation circuit 7 via an amplifier 22.

Figure 1:
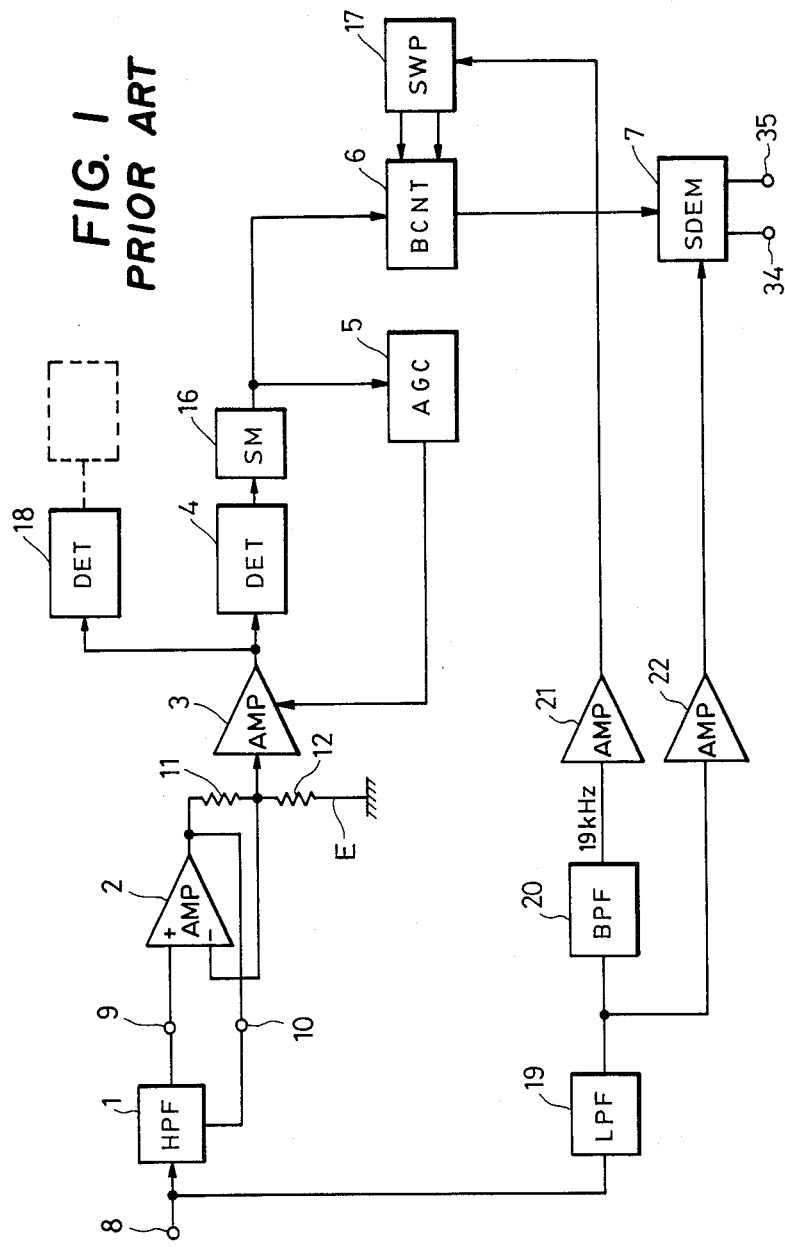
FIG. 1 is a block diagram of a prior art control circuit.
Figure 2:
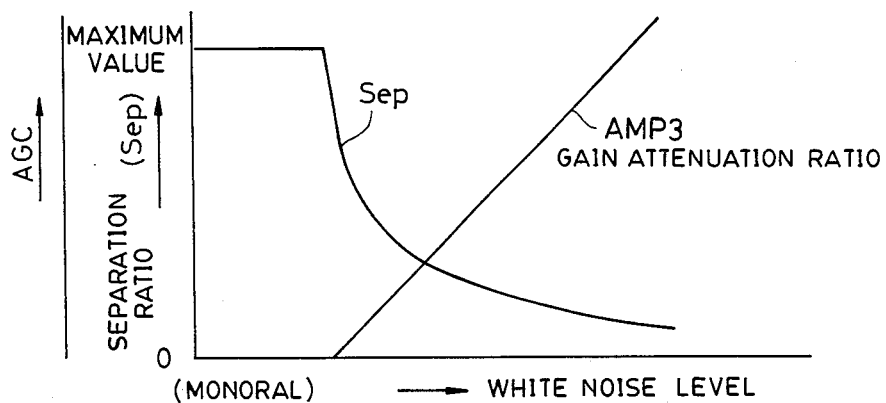
FIG. 2 shows graphs of the separation and of the gain attenuation ratio in the prior art control circuit of FIG. 1.
Figure 4:
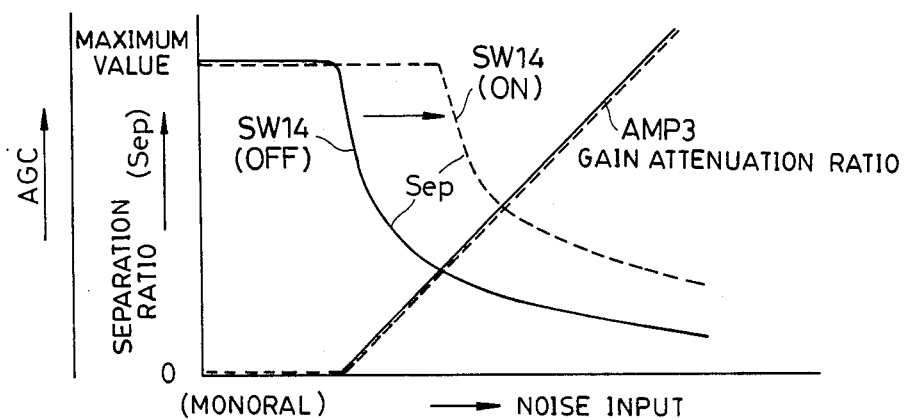
FIG. 4 shows graphs of the separation and of the gain attenuation ratio in the control circuit of FIG. 3.

The most important feature of the circuit of FIG. 3 which is different from that of FIG. 1 is that the output of the amplifier 2 is connected not only to the terminal 10 and the resistor 11 but also to the detection input of the current detection circuit 13 having the two outputs coupled to the AGC drive circuit 5 and the blend control circuit 6 respectively, and that the switch 14 and the resistor 15 are connected in series between the terminal 10 and the reference potential point E (earth). The specific function of the current detection circuit 13 is to detect a variation in the electric current at the output of the amplifier 2 and provide the AGC drive circuit 5 and the blend control circuit 6 with respective control outputs. More specifically, the current detection circuit 13 generates control outputs responsive to a difference between the electric current flowing therefrom when the switch 14 connected to the terminal 10 is opened and the electric current flowing therefrom when the switch 14 is closed. Therefore, by operating the switch 14 so that the current detection circuit 13 generates control voltages responsive to a fluctuation in the electric current, the stereo demodulation circuit 7 can be controlled by use of the control voltage so as to change the point whereat the output separation begins to vary, without changes in the point whereat the AGC operation to the amplifier 3 begins. FIG. 4 shows graphs of the gain attenuation of the amplifier 3 and of the separation at the stereo demodulation outputs with respect to the white noise level. It will be understood from the graphs that the change in the variation starting point of the separation never gives influences to the operation or sensitivity of the other detection circuit 18 which is responsive to the output from the amplifier 3. Additionally, in case that the control circuit is integrated on a semiconductor substrate, other terminals included in the integrated circuit for other purposes may be commonly used as the control terminals for the present control circuit. So it is not necessary to provide additional terminals unique to the control circuit.

Figure 5:
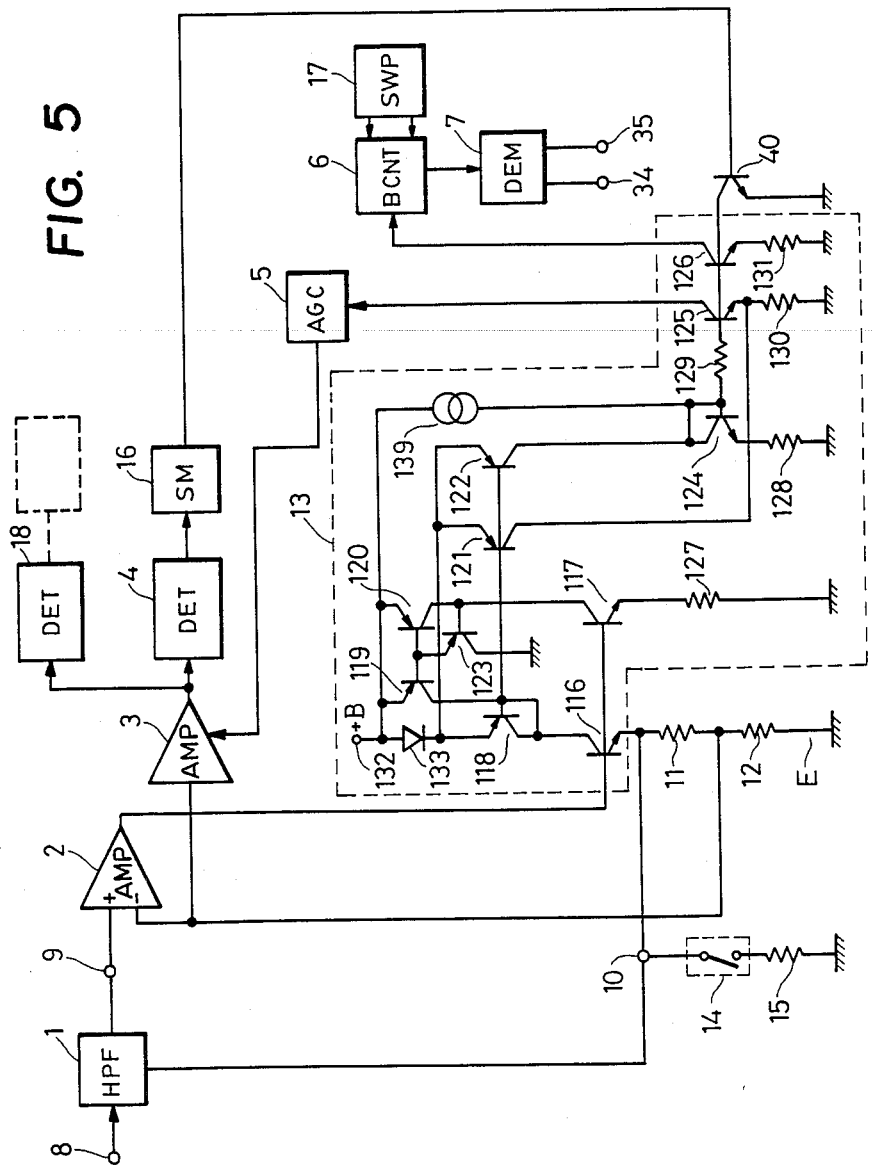
FIG. 5 is a rather detailed block diagram showing a specific circuit arrangement according to the invention.

FIG. 5 shows another embodiment of the invention including a rather detailed specific circuit arrangement of the current detection circuit 13. The low-pass filter 19, band-pass filter 20 and the amplifiers 21 and 22 of FIG. 3 are not illustrated here. The collector of a transistor 116 which constitutes an emitter follower is connected to a point short-circuiting the base and collector of a transistor 118 coupled to a diode 133. The transistor 118 is associated with transistors 121 and 122 to form first current mirror circuit. The emitter of the transistor 116 is connected to the reference potential point E (earth) via resistors 11 and 12 coupled in series, with the junction between the transistors 11 and 12 being connected to the feedback "−" input of the amplifier 2. The base of the transistor 116 is connected to the output of the amplifier 2 and also to the base of a transistor 117. The collector of the transistor 117 is connected to the collector of a transistor 120 and to the base of a transistor 123. The transistors 120, 123 and 119 form second current mirror circuit, with the output thereof, i.e. the collector of the transistor 119 being connected to the point short-circuiting the base and collector of the transistor 118 of the first current mirror circuit. The emitter of the transistor 117 is connected to the reference potential point E (earth) via a resistor 127. The collectors of the transistors 121 and 122 are connected to the emitter of a transistor 125 and to a short-circuited point of the base and collector of a transistor 124. The transistors 124 and 125 cooperate with resistors 128, 129, 130 and 131 to form third current mirror circuit. The collectors of the transistors 125 and 126 of the third current mirror circuit are connected to the AGC drive circuit 5 and to the blend control circuit 6 respectively. In FIG. 5, when the switch 14 connected to the terminal 10 is opened, the current $I_1$ at the collector of the transistor 116 is expressed by:

$$I_1 \approx \frac{V_1}{R_{11} + R_{12}} \quad (1)$$

where $V_1$ is the potential at the emitter of the transistor 116, $R_{11}$ is the resistance of the resistor 11, and $R_{12}$ is the resistance of the resistor 12.

Assuming that the transistor 117 has the same configuration as the transistor 116, the current $I_2$ at the collector of the transistor 117 is expressed by:

$$I_2 \approx V_1/R_{127} \qquad (2)$$

where $R_{127}$ is the resistance of a resistor 127.

If the resistor 127 has a resistance equal to the sum of the resistances of the resistors 11 and 12, expressions (1) and (2) give the following result:

$$I_1 \approx I_2 \qquad (3)$$

Since the second current mirror circuit applies the collector current $I_2$ of the transistor 117 to the collector of the transistor 116 via the transistor 118 of the first current mirror circuit, the transistor 118 is cut off to shut the current to the collectors of the transistors 121 and 122. With this condition, the third current mirror circuit is previously assigned with a reference current from a constant current source 139 which is continuously operative, and actuates the AGC drive circuit 5 and the blend control circuit 6 via the transistors 125 and 126 respectively. More specifically, the output transistor 126 of the current detection circuit 13 of FIG. 5 is a circuit for biasing the current to be applied to the blend control circuit 6 so as to supply it with a constant current while the current detection circuit 13 is inoperative. When the current supplying circuit is actuated, the current bias value decreases, followed by a decrease in the bias value of the differential input from the blend control circuit 6 and hence a decrease in the amplitude of the pulse supplied from the blend control circuit 6. Controls of the gain attenuation of the amplifier 3 and of the separation decrease of the stereo demodulation output with respect to the white noise level are effected by a transistor 40 with the base supplied with the detection output from the white noise level detection circuit 4 via the smoothing circuit 16 and with the collector connected to the bases of the transistors 125 and 126. When the switch 14 connected to the terminal 10 is closed, the current $I_1'$ through the collector of the transistor 116 is expressed by:

$$I_1' \approx \left(\frac{1}{R_{11}+R_{12}} + \frac{1}{R_{15}}\right) V_1 > I_1 \qquad (4)$$

where $R_{15}$ is the resistance of a resistor 15. The emitter potential $V_1$ of the transistor 16 is enclosed in the feedback loop of the amplifier 2 and is not affected by the on-off operation of the switch 14. The collector current $I_2'$ of the transistor 117 is given by expression (2) and is represented by:

$$I_2 \approx V_1/R_{127} \approx I_2 \qquad (5)$$

From expressions (4) and (5), the following result is established:

$$I_1' > I_2' \qquad (6)$$

Since the second current mirror circuit applies the collector current $I_2'$ of the transistor 117 to the collector of the transistor 116 via the transistor 118 of the first current mirror circuit, the transistor 118 supplies a current which is the difference between the currents $I_1'$ and $I_2'$, i.e. $I_1'-I_2'$, and this current difference is used as a reference current of the first current mirror circuit to produce output currents to the collectors of the transistors 121 and 122. In case that the collector of the transistor 121 is connected to the emitter of the transistor 125 for actuating the AGC drive circuit 5 and that the collector of the transistor 122 is connected to the common point of the base and collector of the transistor 124 which constitutes the third current mirror circuit, the reference current of the third current mirror circuit is increased by the collector current of the transistor 122. Therefore, the collector current of the transistor 126 for actuating the blend control circuit 6 can be increased by the current difference detected by the current detection circuit 13 or alternatively by the amount obtained by multiplication of the current difference with a factor, which results in a change of the point whereat the separation of the stereo demodulation circuit output begins to decrease. On the other hand, if the collector current of the transistor 121 is entered in the resistor 130 via the emitter of the transistor 125, it is possible to absorb the increase of the reference current of the third current mirror circuit. Since the collector current of the transistor 125 to actuate the AGC drive circuit 5 can be maintained invariable, the starting point of the separation decrease of the stereo demodulation circuit with respect to the white noise level can be controlled independently without affection to the detection circuit 18, for example, which is provided for other purpose but is responsive to the output from the amplifier 3. It will be apparent to a skilled in the art that the control circuit employing a semi-fixed resistor or a variable resistor instead the switch 14 attains the substantially same controlling operation.

In conclusion, the invention enables a free setting of the point whereat the separation of the stereo demodulation output begins to vary, with no affection to the other detection circuit, and also eliminates requirement of additional terminals unique to the control circuit for circuit integration of this circuit.

The embodiments of the invention which an exclusive property or privilege is claimed are defined as follows:

1. A control circuit which comprises:
   means for supplying frequency-modulated intermediate frequency detection outputs including high band noise components and FM composite signals;
   active filter means to select and output said high band noise components in said frequency-modulated intermediate frequency detection outputs, said active filter means having a feedback terminal;
   first amplifier to amplify the output from said active filter means;
   level detection means to detect the level of said high band noise in the output from said first amplifier;
   smoothing means to smooth the output from said level detection means;
   first control means responsive to the output from said smoothing means to control the gain attenuation of said first amplifier;
   a stereo demodulation circuit;
   means to select said FM composite signals in said intermediate frequency detection output and apply them to said stereo demodulation circuit;
   second control means responsive to the output from said smoothing means to control the separation ratio of the FM stereo demodulation output from said stereo demodulation circuit into right and left stereo channels, there being a threshold level at which said separation ratio begins to vary; and
   current detection means responsive to the current flowing into a resistor connected between said feedback terminal of said active filter means and a reference potential point to control said second control means so as to change said level at which said separation ratio begins to vary.

2. A control circuit of claim 1 wherein said current detection means controls the control operation of said first control means.

3. A control circuit of claiim 1 wherein a switch is interposed between said resistor and said feedback terminal.

4. A control circuit of claim 1 wherein said current detection means comprises:
an emitter follower circuit connected to said active filter means;
first and second current mirror circuits connected to said emitter follower circuit;
third current mirror circuit connected between said second current mirror circuit and said first and second control means; and
a constant current source connected to said, third current mirror circuit.

* * * * *